US007173183B2

(12) United States Patent
McMahon et al.

(10) Patent No.: US 7,173,183 B2

(45) Date of Patent: Feb. 6, 2007

(54) COMBINED FIBER OPTIC REPEATER/POWER SOURCE REMOTE CABINET FOR DISTRIBUTED ANTENNA SYSTEMS

(75) Inventors: Thomas D McMahon, Grosse Isle, MI (US); Rick L. Sputa, Warren, MI (US)

(73) Assignee: Nextel Communications, Inc., Overland Park, KS (US)

( * ) Notice: Subject to any disclaimer, the term of this patent is extended or adjusted under 35 U.S.C. 154(b) by 0 days.

(21) Appl. No.: 11/152,148

(22) Filed: Jun. 15, 2005

(65) Prior Publication Data

US 2006/0283617 A1 Dec. 21, 2006

(51) Int. Cl.
*H02G 3/08* (2006.01)

(52) U.S. Cl. ...................... 174/50; 174/17 R; 174/520; 361/600; 361/724; 220/3.2; 220/4.02

(58) Field of Classification Search ................. 174/50, 174/53, 57, 58, 52.1, 17 R, 17 VA, 520; 361/724, 361/690, 694, 704, 752, 600, 676, 601, 641, 361/677, 678, 679, 687, 727, 726, 796; 424/184; 211/26; 220/3.2, 3.3, 3.6, 3.7, 3.8, 4.02
See application file for complete search history.

(56) References Cited

U.S. PATENT DOCUMENTS 4,369,484 A * 1/1983 Fugate et al. ............... 361/624
4,940,299 A * 7/1990 Lazenby ..................... 312/285
5,150,277 A * 9/1992 Bainbridge et al. ......... 361/724
5,886,296 A * 3/1999 Ghorbani et al. ............. 174/50
6,000,464 A * 12/1999 Scafidi et al. ............... 361/724
6,417,443 B1 * 7/2002 Smith ..................... 174/17 VA
6,501,020 B2 * 12/2002 Grant et al. .................. 174/50
6,548,753 B1 * 4/2003 Blackmon et al.. ........... 174/50
6,603,660 B1 * 8/2003 Ehn et al. ................... 361/694
6,700,062 B1 * 3/2004 Allen, Jr. ..................... 174/53
6,746,092 B2 * 6/2004 Leccia et al. ............... 312/222

* cited by examiner

*Primary Examiner*—Angel R. Estrada

(57) ABSTRACT

Three specific problems or needs related to deployment of fiber optic repeater distributed antenna systems are addressed by providing a particularly configured enclosure or cabinet adapted to protect repeaters from vandalism, enclose power components directly below the repeaters, and provide uninhibited ventilation. The cabinet includes a first cabinet portion partially enclosing a first chamber in which the repeater is receivable, a second cabinet portion at least partially enclosing a second chamber in which the power source components are receivable, and a door mounted to the first cabinet portion so as to be movable between a closed position, in which access to the first chamber is prevented, and an open position, providing access to the first chamber. A locking mechanism by which the door can be securely retained in the closed position includes a handle which is redundantly securable in an inoperative position, thereby preventing locking mechanism operation and precluding access to the first chamber.

27 Claims, 7 Drawing Sheets

59
20
10
18
52
52
12
18

COMBINED FIBER OPTIC REPEATER/POWER SOURCE REMOTE CABINET FOR DISTRIBUTED ANTENNA SYSTEMS

BACKGROUND OF THE INVENTION

Cabinets adapted to house components of a distributed antenna system, such as fiber optic repeater and associated power source components, are commonly configured as unprotected, anchored structures. It is necessary, therefore, for such cabinets to adequately protect the components housed in the cabinets from damage, particularly damage which is intentionally inflicted, and yet readily permit service or replacement of the components when necessary. At the same time, such cabinets must be provided with adequate ventilation, particularly for fiber optic repeater components, by permitting adequate cooling air admission and heated air exhaust. This invention, accordingly, addresses three specific problems or needs related to deployment of fiber optic repeater distributed antenna systems. Specifically, the invention addresses the need to protect fiber optic repeater components from vandalism, the need to enclose power components directly below the repeaters, and the need for uninhibited ventilation, particularly of cabinet portions adapted to house fiber optic repeaters.

SUMMARY OF THE INVENTION

In accordance with one preferred embodiment of the invention, a cabinet is adapted to enclose a fiber optic repeater and power source components for the repeater. The cabinet includes a first cabinet portion partially enclosing a first chamber in which the repeater is receivable, a second cabinet portion at least partially enclosing a second chamber in which the power source components are receivable, and a door mounted to the first cabinet portion so as to be movable between a closed position, in which access to the first chamber is prevented, and an open position, providing access to the first chamber. A locking mechanism by which the door can be securely retained in the closed position includes a handle which is redundantly securable in an inoperative position, thereby preventing locking mechanism operation and precluding access to the first chamber through an opening to the first chamber which is covered by the door. In the particular embodiment described, the first chamber is an upper chamber and the second chamber is a lower chamber, but this is not necessarily so.

The handle is preferably redundantly securable in the inoperative position by a pair of locks. A post, preferably secured to the door and extending through an opening in the handle when the handle is in its inoperative position, advantageously includes a hole through which a shackle of a padlock forming one of the locks can extend. The shackle and the post are sized so that the shackle closely matches an outer contour of the post so as to preclude placement of a cutting device between the shackle and the outer contour. The other lock is preferably disposed at an end of the handle, adapted to retain the handle in its inoperative position, and operable by way of a particular tool, such as a wrench.

The first and second cabinet chambers are ventilated, with the first chamber including at least one manifold adapted to direct air entering into said first chamber to a cooling air intake of the repeater and/or to direct heated air exiting the repeater out of the first chamber. The first chamber includes a shelf which is adapted to accommodate any of several types of fiber optic repeaters and which is slidable between a first position, in which the repeater may be in use, and a second position, in which the repeater may be serviced or replaced.

The first and second chambers are separated by a divider having openings therein adapted to permit interconnection of the repeater and the power source components. In the preferred embodiment of the invention, three connections are enabled: (1) a fiber connection from the ground to the repeater in the upper chamber, (2) a coaxial cable connection from the repeater back out to the antenna mounted on a pole, and (3) a power cable connection from the ground to the power source in the lower chamber and then from the power source to the repeater in the upper chamber.

An enclosure according to the invention thus defines two compartments. One of these compartments is for a repeater, while the other is for power components. A door providing access to the repeater compartment has a dual locking system to prevent vandalism, and the repeater compartment contains a sliding shelf or drawer to hold the repeater equipment. The sliding shelf has interchangeable mountings so as to accommodate both ADC and Mikom/Andrew repeaters, and includes openings for electrical, coaxial, and fiber optic connections.

The cabinet enclosure is designed to provide optimal ventilation. To this end, the bottom front panel enclosing the power equipment compartment is ventilated, the top front panel has a ventilation manifold opening located so as to provide air flow directly to an intake duct on the front of a repeater, and the top hood of the enclosure is also ventilated.

The cabinet, optimally configured, is a ventilated aluminum box having the sliding drawer assembly and the locking, vandal-proof front access door, with the lower, inside panel/door made of steel. Materials other than aluminum, such as steel or plastic, could be used to produce the cabinet. Again, the sliding drawer assembly that holds the fiber optic repeater may be configured with interchangeable mounts to accommodate two (or more) types of repeaters, and ventilation is optimized by having the lower front panel, the upper front panel, and the top hood ventilated. The aluminum is finished with a baked-on powder coating paint which is applied post-manufacture and which serves to make it easier to remove any sort of painted-on graffiti.

In terms of preventing vandalism, the enclosure actually has a two level system. To open the main access door to the fiber optic repeater (i.e., the door providing access to the upper compartment), a heavy gauge padlock must be opened. The padlock is small and positioned so that it is impossible to place a bolt cutter between the door lock assembly and the shackle of the padlock. Once the padlock is open, a particular tool, such as a 7/16" can wrench, is required to get the door open. The fact that a can wrench is not usually carried by members of the public, combined with the fact that the unique padlock system is not susceptible to vandalism by bolt cutters, make the enclosure highly secure.

Other features of the invention will become apparent from the following description when considered in conjunction with the accompanying drawings.

DETAILED DESCRIPTION OF THE INVENTION

Figure 1:
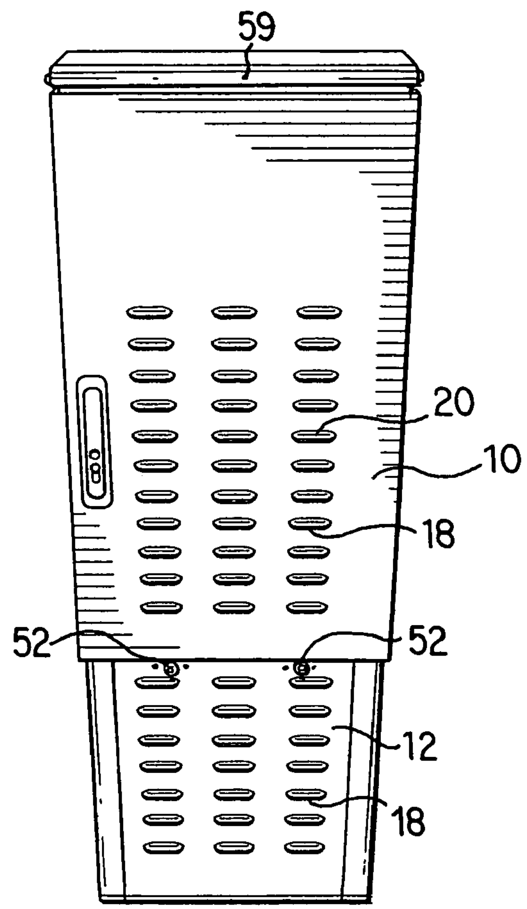
FIG. 1 is a front view of a cabinet according to the present invention.
Figure 2:
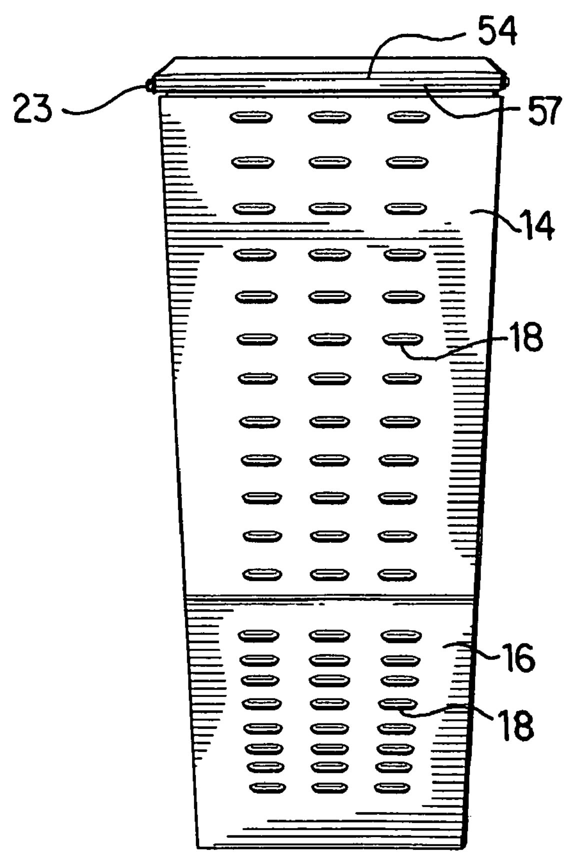
FIG. 2 is a rear view of the cabinet shown in FIG. 1.

A door 10 and a cabinet front lower panel 12 are best seen in the view of the cabinet illustrated in FIG. 1, while cabinet rear upper and lower panels 14 and 16 are best seen in the illustration provided by FIG. 2. The door 10 and the panels 12, 14, and 16 are all provided with slots 18 which permit air circulation in a manner which will be described. The door and the panel material is deformed immediately above each of the slots so as to define overhanging, rain-deflecting protrusions 20.

Figure 3:
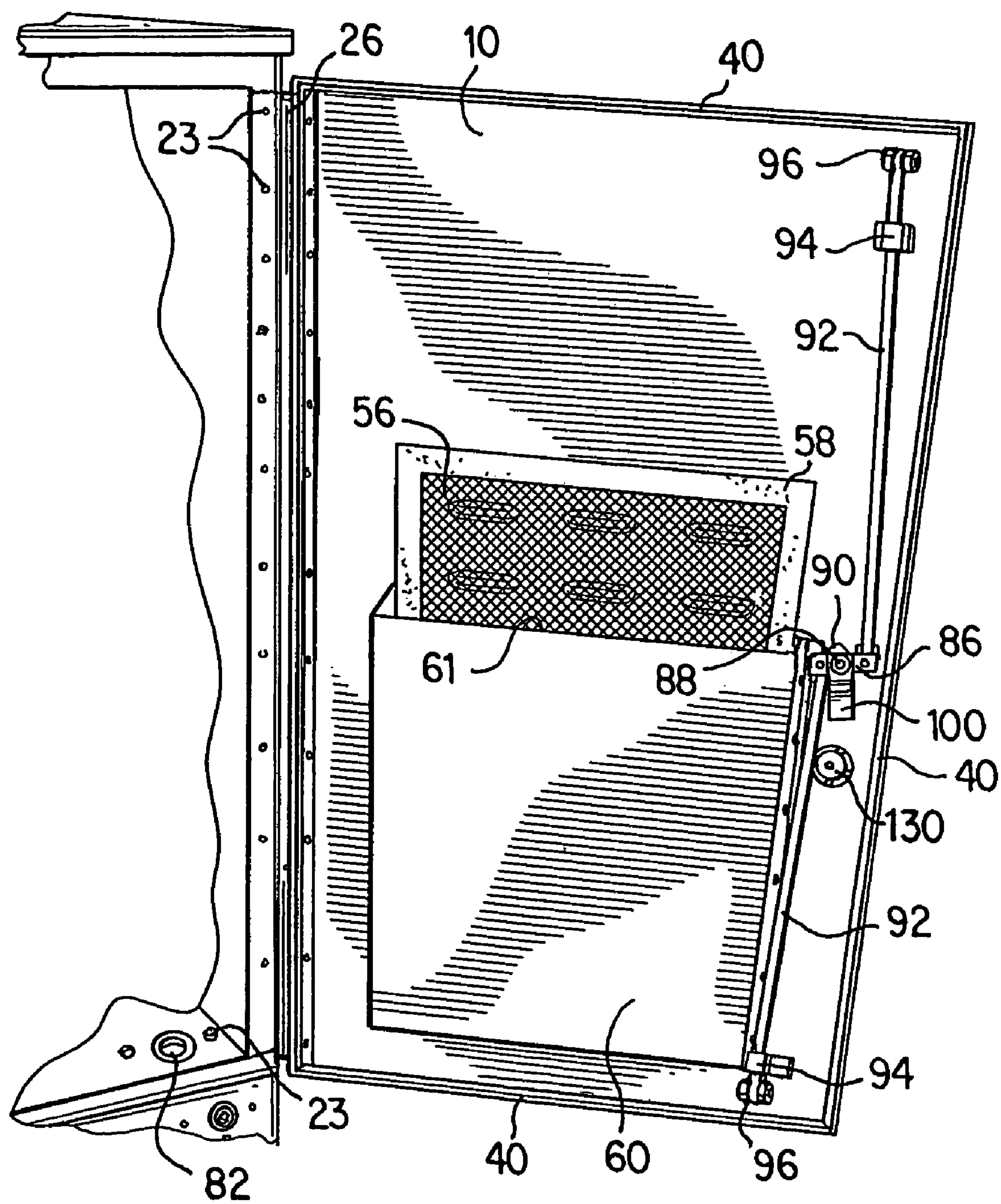
FIG. 3 is a view of the interior side of a door which closes an opening to an upper chamber of the cabinet.
Figure 4:
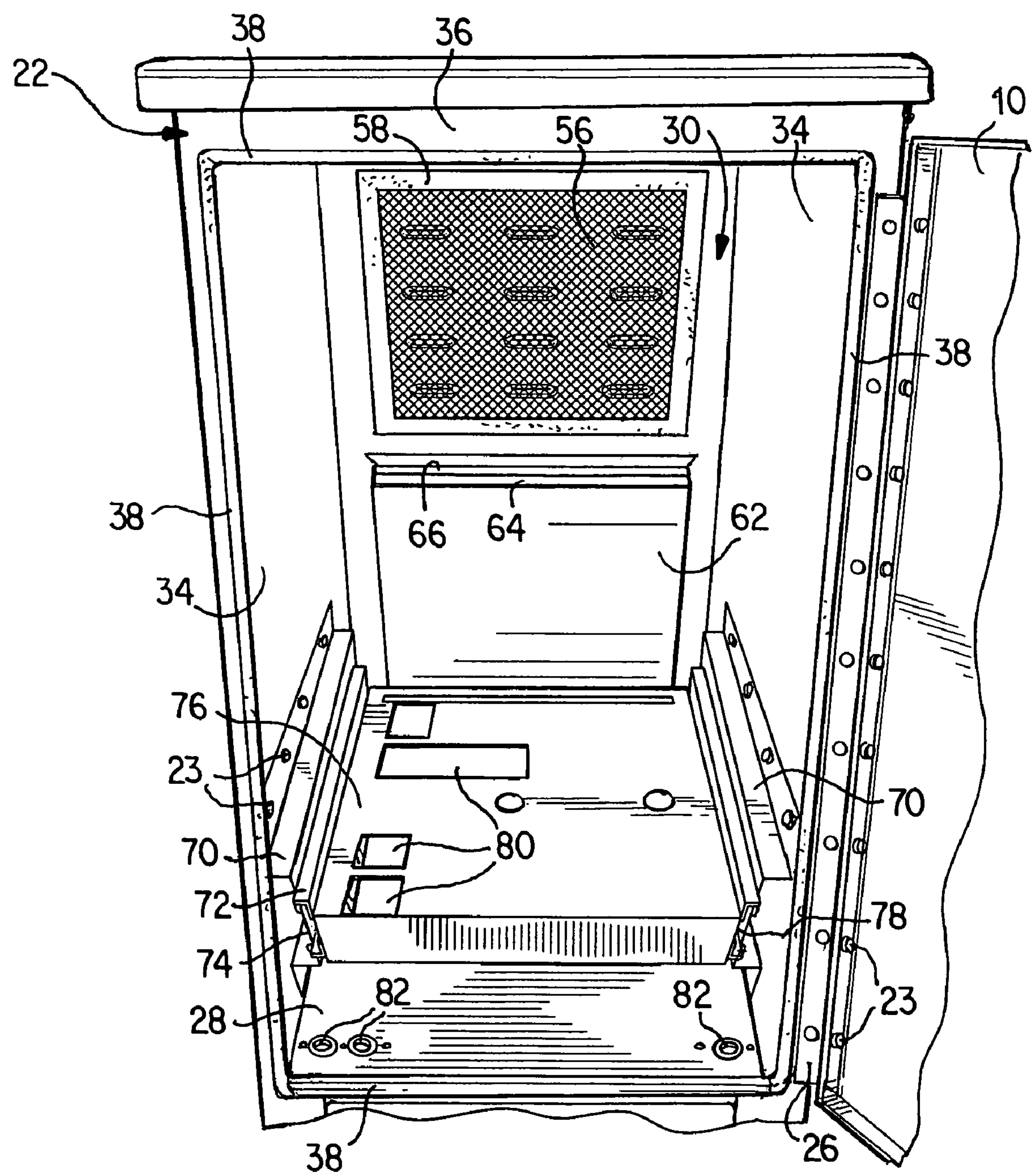
FIG. 4 is a view of the upper chamber of the cabinet showing a sliding shelf within the upper chamber in a pushed-in position.
Figure 5:
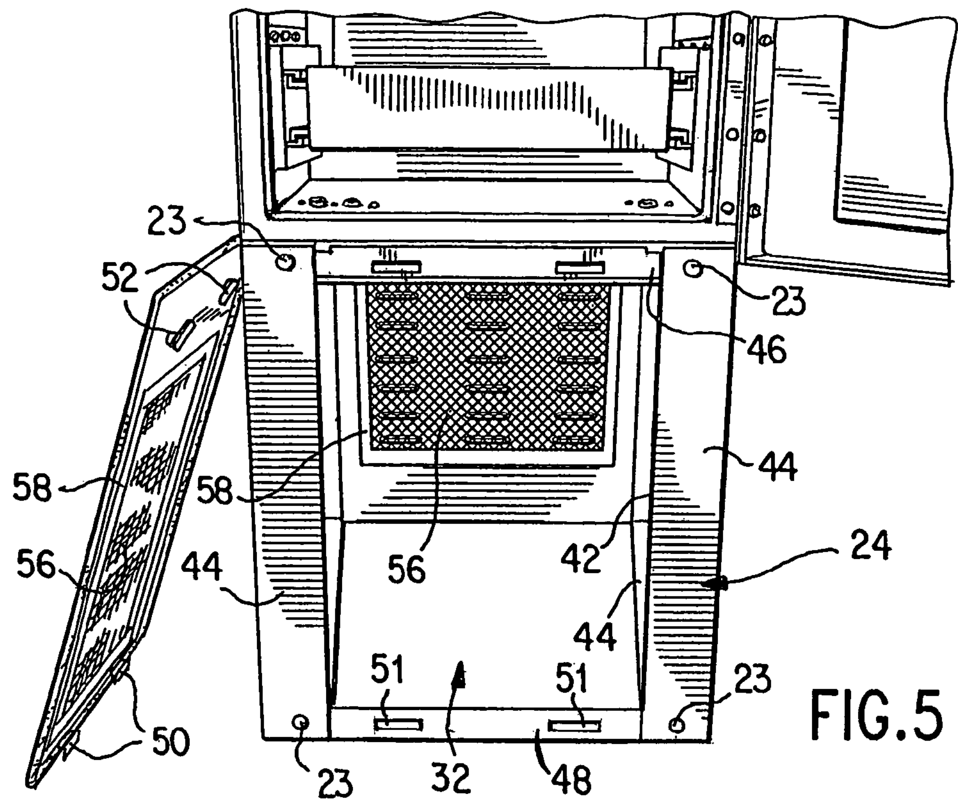
FIG. 5 is a view of the cabinet with its front lower panel removed and showing a lower cabinet chamber.

The cabinet rear upper panel 14 forms part of an upper cabinet frame portion, which is generally designated 22 as shown in FIG. 4, while the cabinet rear lower panel 16 forms part of a lower cabinet frame portion, which is generally designated 24 as shown in FIG. 5. The upper and lower cabinet frame portions may be unitary but, as illustrated, are separately constructed and then joined together. A hinge 26 is secured by connectors 23 such as bolts or other fasteners, rivets, or welds, as appropriate, to both the door 10 and the upper cabinet frame portion and interconnects the door and the upper cabinet frame portion so that the door 10 can swing between the closed position shown in FIG. 1 and the open position shown in FIGS. 3 and 4.

A lower divider wall 28 defines a base or bottom of an upper chamber 30, adapted to receive the repeater, and separates the upper chamber 30 from a lower chamber 32, adapted to receive the power components for the repeater. The divider wall 28 thus constitutes a floor of the upper cabinet frame portion 22, and, as is apparent from FIG. 3, may operate to secure that upper cabinet frame portion 22 to the lower cabinet frame portion 24 through the use of connectors 23.

The upper cabinet frame portion 22 includes the divider wall 28, a pair of side walls 34 extending upwardly from the divider 28, and a top wall 31 (see FIG. 6) interconnecting the side walls 34 at the upper ends of the side walls. The cabinet rear upper panel 14, the lower divider wall 28, the top wall 31, and the side walls 34 may be of a one-piece, unitary construction and together form the upper cabinet frame portion 22.

Figure 8:
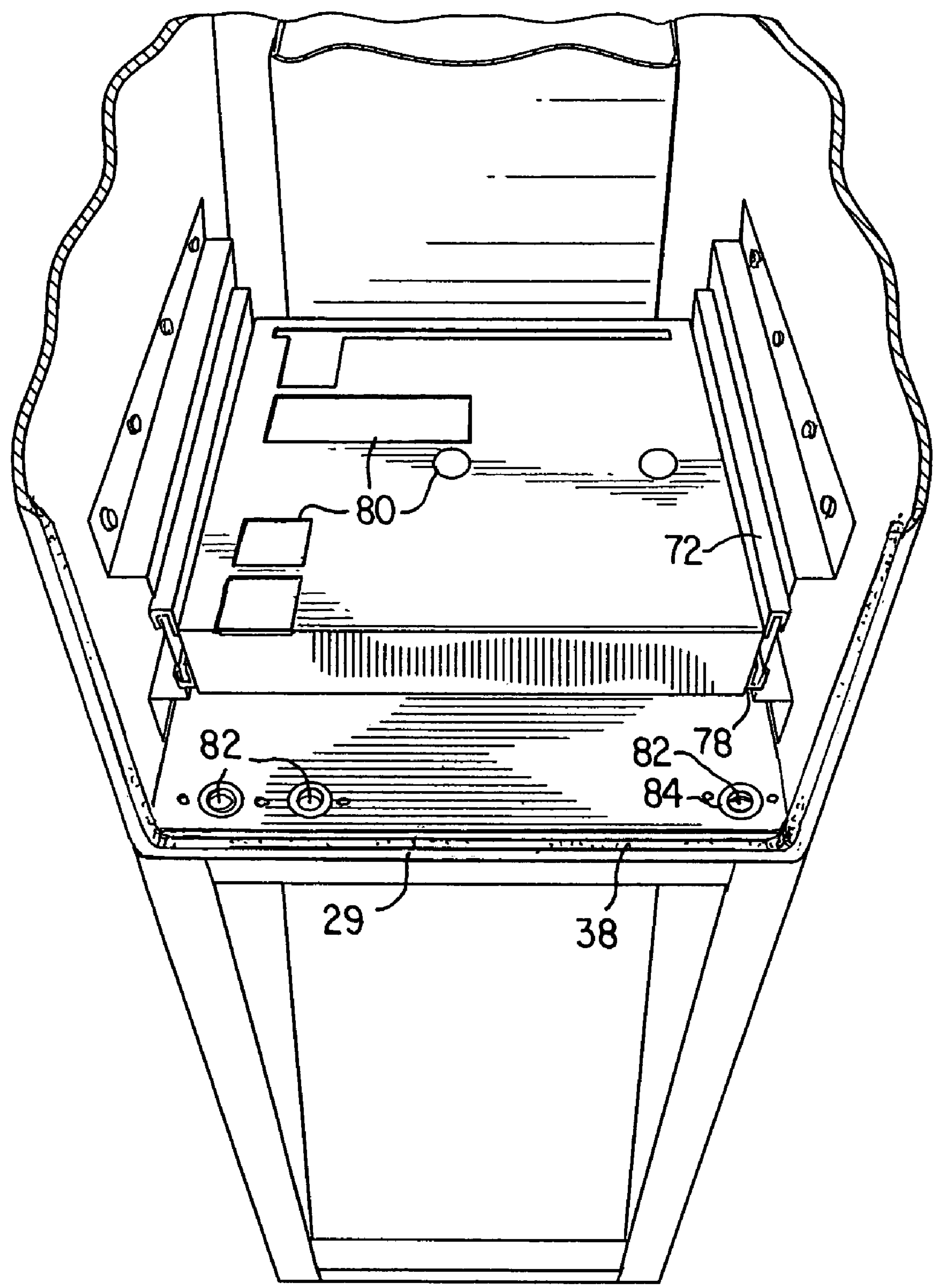
FIG. 8 is a view showing openings in a divider wall located between the upper and lower chambers of the cabinet.

The front surface 36 of the top wall 31 is visible in FIG. 4. A flange 29 (see FIG. 8), defined at forwardly facing edges of the divider wall 28, the side walls 34, and the front surface 36, delimits a forward opening into the upper chamber 30, and is provided with resilient sealing material 38. The material 38 provided on the flange delimiting the upper chamber opening cooperates with another flange 40 defined around the perimeter of the door 10 in order to provide adequate sealing against water intrusion when the door 10 is closed.

The lower cabinet frame portion 24 includes the cabinet rear lower panel 16 and a pair of side walls 42 with flanges 44 defined at least partially around the perimeter thereof. The cabinet rear lower panel 16 and the side walls 42 with the flanges 44 may be of a one-piece, unitary construction and together form the lower cabinet frame portion 24. A front upper lateral member 46 and a front lower lateral member 48 are adapted to be fastened by connectors 23 to the flanges 44. The flanges 44 at the forward facing portion of the frame portion 24 and the front lateral members 46 and 48 delimit a forward opening into the lower chamber 32.

As is best shown in FIG. 5, a flange or flanges 50 depending from the lower edge of the cabinet front lower panel 12 can be received in a hole or holes 51 in the front lower lateral member 48, and at least one rotatable locking element 52 cooperates with the front upper lateral member 46, thereby securing the cabinet front lower panel 12 in place on the lower cabinet frame portion 24. As illustrated, two rotatable locking elements 52, which are star locks, are provided. The use of a can wrench such as that which will be described may be required to rotate each locking element 52. Alternatively, the use of a key or other such element could be required.

Figure 6:
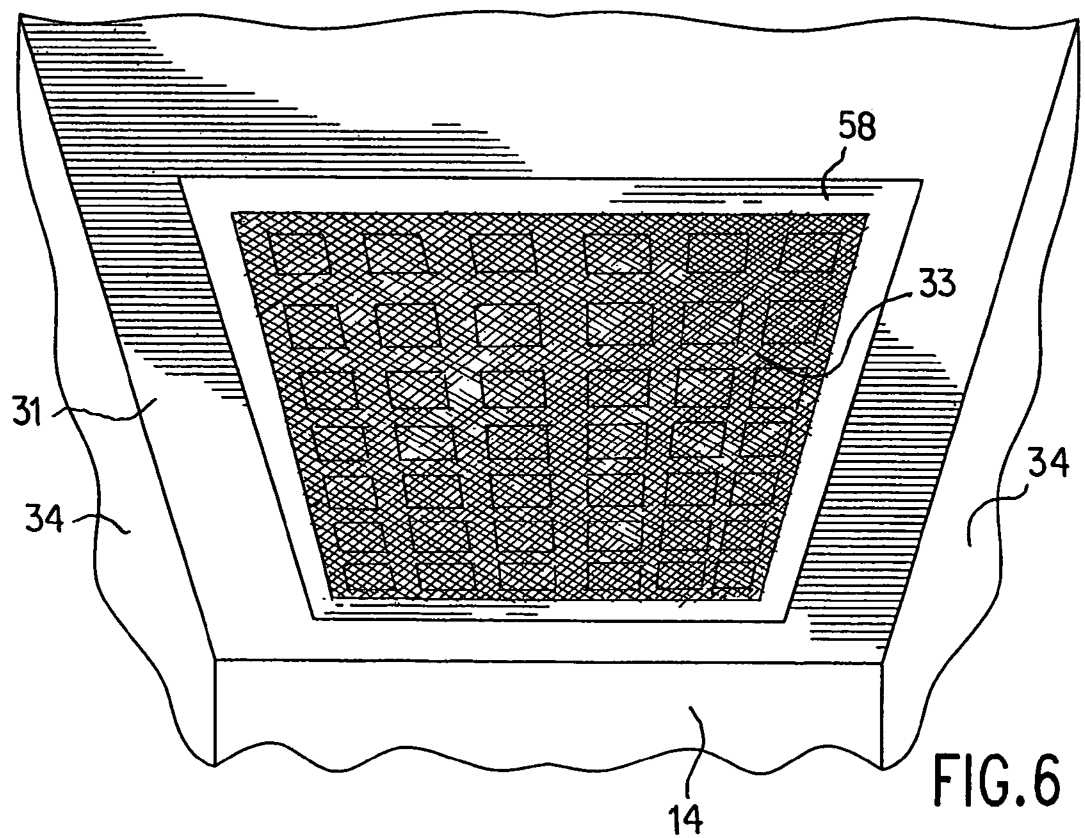
FIG. 6 is a view of a top wall of the upper chamber shown in FIG. 4.

A top cover 54 is secured by connectors 23 to the top of the upper cabinet frame portion 22 and encloses the top wall 31 of the upper cabinet frame portion 22. The top wall 31 includes an opening therein, which opening is visible in FIG. 6. A ventilation grid 33 is secured to the inner surface of or, alternatively, formed in, the top wall 31 as shown in FIG. 6. Air is thus permitted to flow out of the upper chamber 30 through the ventilation grid 33 and then through spaces (not shown) defined between rear and front overhanging portions 57 and 59 of the top cover 54 and the upper surface of the top wall 31.

As best seen in FIGS. 3, 4, and 5, screen filters 56 are secured, by adhesive 58, to the inner surfaces of the door 10 and the panels 12, 14, and 16 so as to prevent insects from entering into the chambers 30 and 32 through the slots 18. A screen filter may optionally be secured over the ventilation grid 33 for the same reason, as shown in FIG. 6.

Figure 7:
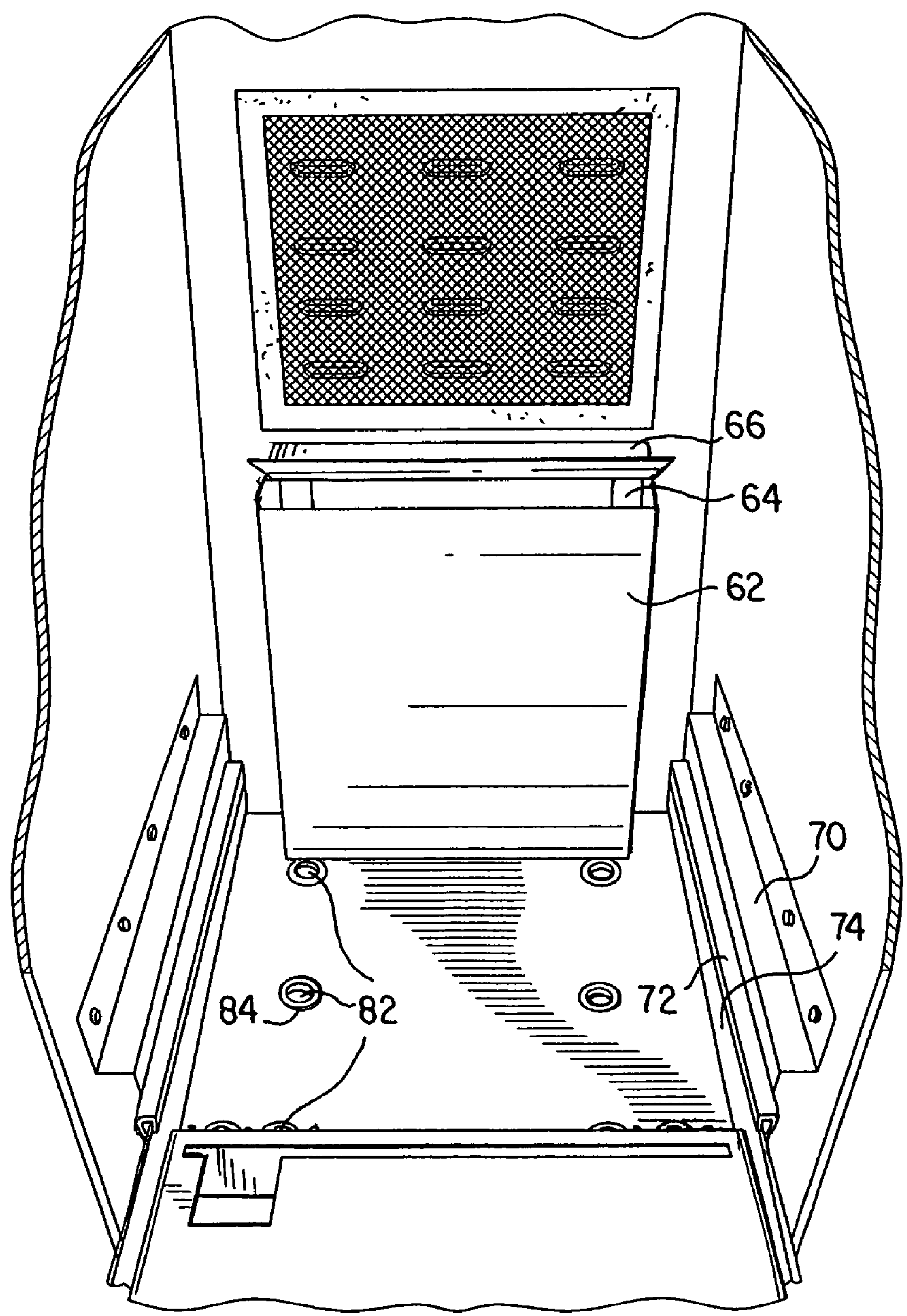
FIG. 7 is a view of the upper chamber which is similar to the view of FIG. 4 but in which the sliding shelf is illustrated in a pulled-out position.

The door 10 is provided with a supply manifold 60 riveted or otherwise attached to the interior thereof. The supply manifold 60 has an opening 61 which is adapted to line up with a cooling air intake of a fiber optic repeater, which is to be located in the upper chamber 30, so as to direct air entering into the chamber 30 through the slots 18 in the door 10 to that cooling air intake. The cabinet rear upper panel 14, similarly, is provided with an exhaust manifold 62 riveted or otherwise attached to the interior thereof. Heated air exiting the repeater will enter an opening 64 of the exhaust manifold 62 and is then directed out of the cabinet. A deflector 66, best shown in FIG. 7, facilitates entry of the heated air exiting the repeater into the exhaust manifold opening 64.

A substantially U-shaped bracket 70 is secured by connectors 23 to each of the side walls 34 forming part of the upper cabinet frame portion 22. The brackets 70 oppose and are parallel to each other. Each bracket 70 has a track 72 provided on its side facing the other bracket 70. Each track 72 is adapted to receive a corresponding guide 74 provided on opposite lateral sides 78 of a sliding shelf 76. The tracks 72 and the guides 74 cooperate to permit the shelf to slide between a pushed-in position, illustrated in FIGS. 4–5 and 8, and a pulled-out position, illustrated in FIG. 7. The fiber optic repeater, in use, is disposed on the shelf 76. By way of the tracks 72 and the guides 74, the shelf is readily displaced between its pushed-in position, in which the repeater may be in use, and its pulled-out position, in which the repeater may be serviced or replaced.

The shelf 76 has openings 80 defined therein which are adapted to accommodate any of several types of fiber optic repeater equipment, such as the Mikom/Andrew and ADC fiber optic repeaters mentioned. The openings 80 provide for mounting of either type of repeater, should it be necessary or desirable to replace one repeater type with another. It is alternatively possible, of course, to replace one shelf 76 having openings specific to one type of repeater with another shelf 76 having openings specific to another type of repeater.

As illustrated in FIGS. 3, 4, 7, and 8, the divider wall 28 is provided with access holes 82 for the necessary electrical, coaxial, and fiber optic cable connections. Bearing rings 84, in the form of rubber grommets, are incorporated in the access holes to prevent cable damage.

A crank 86, best shown in FIG. 3, is mounted on and affixed to a crankshaft 88 extending through the door 10 by way of an appropriate bearing element 90. Rods 92 are pivotally secured to opposite ends of the crank 86, and pass through guides 94 affixed to the interior of the door 10. Rotation of the crankshaft 88 in a clockwise direction as seen in FIG. 3 causes rotation of the crank 86 which, in turn, causes ends 96 of the rods 92 to retract or move toward one another, while rotation of the crankshaft 88 in a counter-clockwise direction causes the ends 96 to extend or move away from one another. Ends 96 may be configured as rollers. By appropriate rotation of the crankshaft, therefore, the ends 96 of the rods may be displaced into and out of engagement with a rear surface of the flange 29, best seen in FIG. 8, so as to lock and unlock the door 10 when the door is in its closed position. At the same time, a locking plate 100 defined on or attached to the crank 86 is moved into and out of engagement with the flange rear surface. The door 10 may therefore be securely retained in its closed position at three separate locations by the ends 96 of the rods 92 and the locking plate 100.

Figure 9:
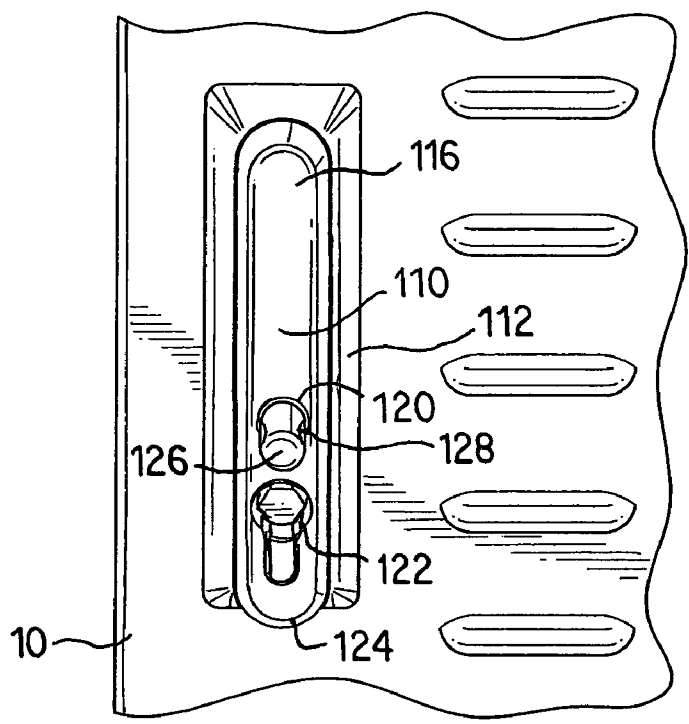
FIG. 9 is a view of a handle forming part of the locking mechanism in an inoperative or closed position.
Figure 10:
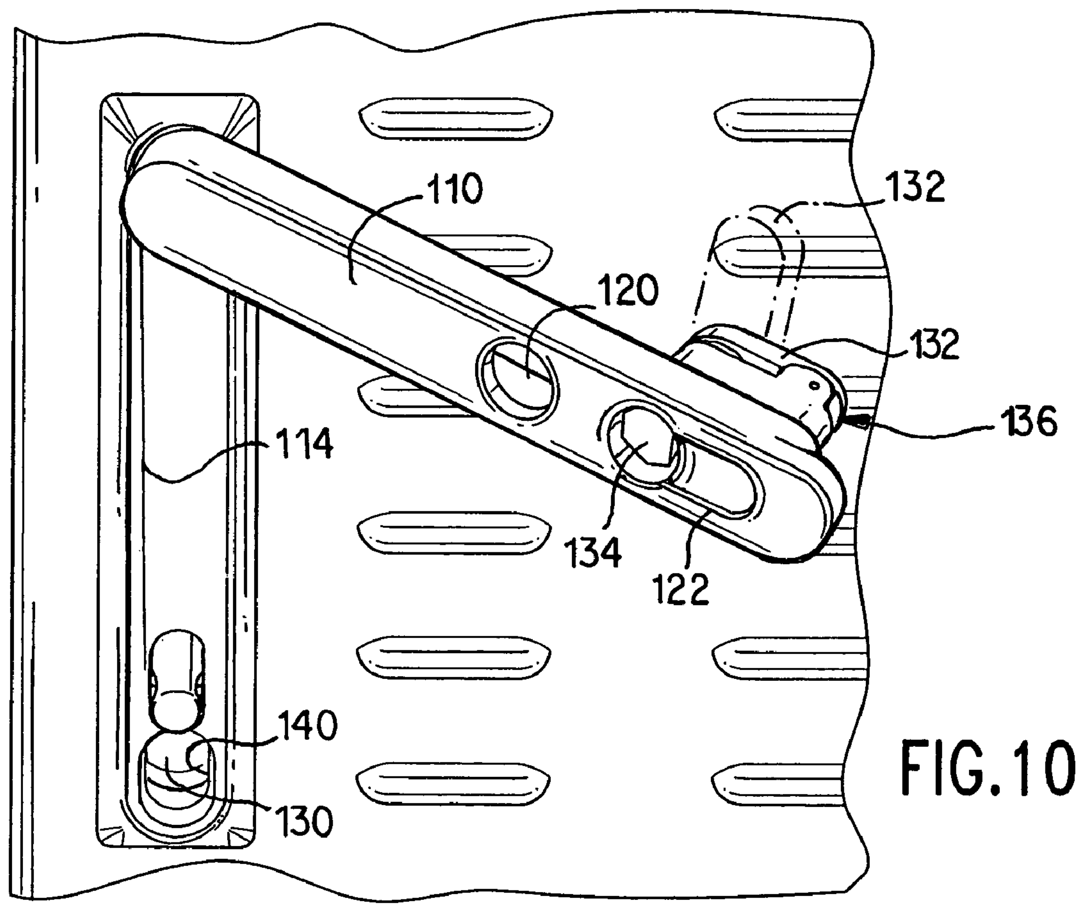
FIG. 10 is a view of the handle in an operative or open position.

Referring now to FIGS. 9 and 10, operation of the overall locking mechanism of the door 10, which locking mechanism includes the crank 86, the rods 92, and the plate 100 mentioned, will be described. A handle seat 112 is welded or otherwise secured to the exterior surface of the door 10, and includes a central opening 114. The central opening of the handle seat is configured so as to receive a handle 110, which forms part of the locking mechanism, when that handle is in its inoperative or closed position. FIG. 9 shows the handle 110 in its closed position, while FIG. 10 shows the handle 110 in its operative or open position.

At its upper end 116, the handle 110 is secured by a conventional ball joint and pin or other such coupling (not shown) to the crankshaft 88, which extends through the door 10 to the crank 86. The coupling is configured such that the handle 110 is permitted by the coupling to pivot outwardly, e.g. about an axis defined by the coupling pin, with respect to the door 10 but is rotationally fixed to the crankshaft 88, e.g. by the pin, so that rotation of the handle produces rotation of the crankshaft which, in turn, causes rotational movement of the crank 86 and the locking plate 100 and longitudinal movement of the rods 92 with respect to the guides 94.

The handle 110 also includes a first opening 120 roughly near the longitudinal midpoint thereof and a second opening 122 closer to its lower end 124. A padlock post 126 is welded or otherwise secured to the door 10, as best seen in FIGS. 9 and 10, and extends outwardly from the door 10. When the handle 110 is in the closed position shown in FIG. 9, the padlock post 126 extends through the first handle opening 120. The padlock post 126 includes a hole or bore 128 provided therein which is adapted to receive the shackle of a particularly configured, heavy gauge padlock, in a manner which will be described, which assists in locking the handle 110 in its closed position.

The padlock used is sufficiently small in size, and the diameter of the padlock post 126 is sufficiently large, that the shackle of the padlock closely matches the contour of the padlock post 126, thereby making it impossible to place a bolt cutter between the padlock post and the shackle of the padlock.

A receptacle 130 is mounted to the interior of the door 10 and is adapted to receive an oblong plate or other locking element 132 of a handle mounted lock 136 disposed at the lower end 124 of the handle 110. The locking element 132 can be operated by rotation of an actuation element to retain the end 124 of the handle in place or to permit movement of the end 124. Operation of the handle-mounted lock 136, by engagement and disengagement of the locking element 132 which will be described, is effected by rotating a hexagonally-shaped head 134 of a bolt-shaped actuation element.

FIG. 10 shows the locking element 132 disposed in a first position by solid lines and in a second position by phantom lines. The locking element 132 is rigidly connected, by a shaft of the actuation element, to the hexagonally shaped head 134, which also forms part of the actuation element. When the locking element 132 is in its first position, the longer sides of the locking element are aligned with the body of the handle 110, and the locking element 132 can pass through an oblong opening 140 defined in the door 10. The handle 110 can be freely moved about the coupling at its upper end 116 between the inoperative or closed position shown in FIG. 9 and the operative or open position when the locking element 132 is in its first position. If the locking element 132 is moved out of its first position and into a second position such as that illustrated in phantom in FIG. 10, the locking element 132 is prohibited from passing through the oblong opening 140. After the locking element 132 has passed through the opening 140 so that it is received within the receptacle 130, therefore, the locking element 132 can be moved out of its first position by rotation of the hexagonally-shaped head 134 to preclude movement of the handle 110 out of the inoperative or closed position shown in FIG. 9. Conversely, the locking element can also be moved from a second position back into its first position by rotation of the hexagonally shaped head 134. Once the padlock has been removed from the padlock post 126, therefore, a particular tool, such as a 7/16" can wrench, is still required to produce the requisite rotation of the hexagonally shaped head 134 in order to get the door 10 open. Since such a tool is typically not readily available to the public, and since the particularly configured padlock is not susceptible to vandalism by bolt cutters, the handle 110 is redundantly locked in its closed position in a manner which is highly secure.

The invention can be used to house Mikom/Andrew and ADC fiber optic repeaters and the associated power transformers in a particularly advantageous manner, and defines a standard for a ground mounted, vandal-proof, highly secure, and ventilated electrical enclosure that meets NEMA (National Electrical Manufacturers Association) 3 rainproofing standards. In one preferred configuration, the invention is 53" high by 22" wide by 29" deep. The lower compartment is 19" high and designed to hold the power components associated with fiber optic repeaters in distributed antenna systems. The 39" high upper compartment contains the sliding drawer assembly and is designed to securely house and provide ready access to a fiber optic repeater and, specifically, the Andrew/Mikom and ADC type components used in Nextel's Distributed Antenna System networks across the country.

The foregoing disclosure has been set forth merely to illustrate the invention and is not intended to be limiting. Since modifications to the disclosed embodiments incorporating the spirit and substance of the invention may occur to persons of ordinary skill in the art, the invention should be construed to include everything within the scope of the appended claims and equivalents thereof.

We claim:

1. A cabinet adapted to enclose a fiber optic repeater and power source components for the repeater comprising:

a first cabinet portion partially enclosing a first chamber in which the repeater is receivable, a second cabinet portion at least partially enclosing a second chamber in which the power source components are receivable, a door mounted to the first cabinet portion so as to be movable between a closed position, in which access to the first chamber is prevented, and an open position, providing access to the first chamber, and a locking mechanism by which the door can be securely retained in the closed position, wherein the locking mechanism includes a handle which is pivotally connected at one end thereof to the door and redundantly securable in an inoperative position, thereby preventing locking mechanism operation and precluding access to the first chamber through an opening to the first chamber which is covered by the door.

2. The cabinet as defined by claim 1, wherein the handle is redundantly securable in the inoperative position by a pair of locks.

3. The cabinet as defined by claim 1, wherein said first and second chambers are ventilated.

4. The cabinet as defined by claim 3, wherein said first chamber includes a manifold adapted to direct air entering into said first chamber to a cooling air intake of the repeater.

5. The cabinet as defined by claim 3, wherein said first chamber includes a manifold adapted to direct heated air exiting the repeater out of the first chamber.

6. The cabinet as defined by claim 1, wherein said first chamber includes a shelf adapted to accommodate any of several types of fiber optic repeaters.

7. The cabinet as defined by claim 1, wherein said first chamber includes a shelf upon which the repeater is disposable, and wherein the shelf is slidable between a first position, in which the repeater may be in use, and a second position, in which the repeater may be serviced or replaced.

8. The cabinet as defined by claim 1, wherein the first and second chambers are separated by a divider having openings therein adapted to permit interconnection of the repeater and the power source components.

9. The cabinet as defined by claim 1, wherein said first chamber is an upper chamber and the second chamber is a lower chamber.

10. A cabinet adapted to enclose a fiber optic repeater and power source components for the repeater comprising:

a first cabinet portion partially enclosing a first chamber in which the repeater is receivable, a second cabinet portion at least partially enclosing a second chamber in which the power source components are receivable, a door mounted to the first cabinet portion so as to be movable between a closed position, in which access to the first chamber is prevented, and an open position, providing access to the first chamber, a locking mechanism by which the door can be securely retained in the closed position, the locking mechanism including a handle which is redundantly securable in an inoperative position, thereby preventing locking mechanism operation and precluding access to the first chamber through an opening to the first chamber which is covered by the door, the handle being redundantly securable in the inoperative position by a pair of locks, and a post secured to the door and extending through an opening in the handle when the handle is in its inoperative position, wherein said post includes a hole through which a shackle of one of said locks can extend.

11. The cabinet as defined by claim 10, wherein the other of said locks is disposed at an end of the handle and is adapted to retain the handle in its inoperative position.

12. The cabinet as defined by claim 11, wherein the other of said locks is operable by way of a tool.

13. The cabinet as defined by claim 12, wherein said tool is a wrench.

14. The cabinet as defined by claim 10, wherein the shackle of the one of the locks closely matches an outer contour of the post, thereby precluding placement of a cutting device between the shackle and the outer contour.

15. A ventilated cabinet adapted to enclose a fiber optic repeater and power source components for the repeater comprising:

a first cabinet portion partially enclosing a first chamber in which the repeater is receivable, a second cabinet portion at least partially enclosing a second chamber in which the power source components are receivable, a door mounted to the first cabinet portion so as to be movable between a closed position, in which access to the first chamber is prevented, and an open position, providing access to the first chamber, a locking mechanism by which the door can be securely retained in the closed position, a supply manifold attached to an interior of the door for guiding air entering into the first chamber to a cooling air intake of the repeater.

16. The ventilated cabinet as defined by claim 15, wherein said first chamber includes a shelf adapted to accommodate any of several types of fiber optic repeaters.

17. The ventilated cabinet as defined by claim 15, wherein said first chamber includes a shelf upon which the repeater is disposable, and wherein the shelf is slidable between a first position, in which the repeater may be in use, and a second position, in which the repeater may be serviced or replaced.

18. The ventilated cabinet as defined by claim 15, wherein the first and second chambers are separated by a divider having openings therein adapted to permit interconnection of the repeater and the power source components.

19. The ventilated cabinet as defined by claim 15, wherein the locking mechanism includes a handle which can be redundantly secured in an inoperative position.

20. The ventilated cabinet as defined by claim 19, wherein the handle can be redundantly secured in the inoperative position by a pair of locks.

21. The ventilated cabinet as defined by claim 20, wherein one of said locks is disposed at an end of the handle and is adapted to retain the handle in its inoperative position.

22. The ventilated cabinet as defined by claim 15, wherein said first chamber is an upper chamber and the second chamber is a lower chamber.

23. The ventilated cabinet as defined in claim 15, and further comprising at least one filter through which air travels as it passes into the first chamber.

24. A cabinet adapted to enclose a selected component of a distributed antenna system and power source components for the selected component comprising:

a first cabinet portion partially enclosing a first chamber in which the selected component is receivable, a second cabinet portion at least partially enclosing a second chamber in which the power source components are receivable, a door mounted to the first cabinet portion so as to be movable between a closed position, in which access to the first chamber is prevented, and an open position, providing access to the first chamber, and a locking mechanism by which the door can be securely retained in the closed position, wherein the locking mechanism includes a handle which is pivotally connected at one end thereof to the door and redundantly securable in an inoperative position, thereby preventing locking mechanism operation and precluding access to the first chamber through an opening to the first chamber which is covered by the door.

25. The cabinet as defined by claim 24, wherein the handle is redundantly securable in the inoperative position by a pair of locks.

26. The cabinet as defined by claim 24, wherein said first and second chambers are ventilated.

27. A ventilated cabinet adapted to enclose a selected component of a distributed antenna system and power source components for the selected component comprising:

a first cabinet portion partially enclosing a first chamber in which the selected component is receivable, a second cabinet portion at least partially enclosing a second chamber in which the power source components are receivable, a door mounted to the first cabinet portion so as to be movable between a closed position, in which access to the first chamber is prevented, and an open position, providing access to the first chamber, and a locking mechanism by which the door can be securely retained in the closed position, a supply manifold attached to an interior of the door for guiding air entering into the first chamber to a cooling air intake of the selected component.

* * * * *